(12) United States Patent
Pi

(10) Patent No.: US 8,627,171 B2
(45) Date of Patent: Jan. 7, 2014

(54) TECHNIQUES FOR CYCLIC REDUNDANCY CHECK ENCODING IN COMMUNICATION SYSTEM

(75) Inventor: Zhouyue Pi, Allen, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 190 days.

(21) Appl. No.: 13/096,754

(22) Filed: Apr. 28, 2011

(65) Prior Publication Data

US 2011/0271169 A1 Nov. 3, 2011

Related U.S. Application Data

(60) Provisional application No. 61/330,722, filed on May 3, 2010.

(51) Int. Cl.
*H03M 13/00* (2006.01)
*H04N 7/12* (2006.01)
*G06F 11/00* (2006.01)

(52) U.S. Cl.
USPC ........... 714/758; 714/800; 714/807; 714/821; 714/E11.032; 375/240.23; 375/240.27; 370/241; 370/242

(58) Field of Classification Search
USPC .................. 714/758, 800, 807, 821, E11.032; 375/240.23, 240.27; 370/241, 242
See application file for complete search history.

(56) References Cited

U.S. PATENT DOCUMENTS

| | | | |
|---|---|---|---|
| 6,438,119 B1 * | 8/2002 | Kim et al. ..................... | 370/335 |
| 6,609,226 B1 * | 8/2003 | Figueira ........................ | 714/807 |
| 7,185,266 B2 * | 2/2007 | Blightman et al. ........... | 714/776 |
| 7,546,511 B2 * | 6/2009 | You et al. ...................... | 714/758 |
| 7,793,194 B2 * | 9/2010 | Seo et al. ....................... | 714/776 |
| 7,853,857 B2 * | 12/2010 | Buckley et al. ............... | 714/781 |
| 8,010,865 B2 * | 8/2011 | Gu et al. ........................ | 714/752 |
| 8,205,143 B2 * | 6/2012 | Buckley et al. ............... | 714/781 |
| 8,295,243 B2 * | 10/2012 | Malladi et al. ................ | 370/331 |
| 8,327,237 B2 * | 12/2012 | Buckley et al. ............... | 714/781 |
| 2002/0194571 A1 * | 12/2002 | Parr et al. ...................... | 714/800 |
| 2008/0209302 A1 * | 8/2008 | Yang et al. .................... | 714/755 |
| 2009/0268680 A1 * | 10/2009 | Nam et al. ..................... | 370/329 |
| 2010/0203866 A1 * | 8/2010 | Li et al. ......................... | 455/411 |
| 2010/0232373 A1 * | 9/2010 | Nory et al. .................... | 370/329 |

(Continued)

OTHER PUBLICATIONS

Steepest Ascent Ltd., LTE Toolbox Control Signaling—Downlink Control Channel, 2009, Steepest Ascent Ltd., pp. 1-13.*

*Primary Examiner* — John J Tabone, Jr.

(74) *Attorney, Agent, or Firm* — Jefferson IP Law, LLP

(57) ABSTRACT

A method and apparatus for generating a Cyclic Redundancy Check (CRC) encoded message in a communication system are provided. The method includes generating the message, generating a first CRC for the message, generating a second CRC for the message, scrambling the first CRC by a first bit sequence of the message, and scrambling the second CRC by a second bit sequence of the message. The apparatus includes a message generator, a first CRC encoder, and a second CRC encoder. The message generator generates a message. The first CRC encoder generates a first CRC for the message, and scrambles the first CRC by a first bit sequence of the message. The second CRC encoder generates a second CRC for the message, and scrambles the second CRC by a second bit sequence of the message.

39 Claims, 9 Drawing Sheets

(56) References Cited

U.S. PATENT DOCUMENTS

| | | | |
|---|---|---|---|
| 2011/0110337 A1* | 5/2011 | Grant et al. | 370/335 |
| 2011/0141941 A1* | 6/2011 | Lee et al. | 370/252 |
| 2011/0143796 A1* | 6/2011 | Lee et al. | 455/507 |
| 2011/0170480 A1* | 7/2011 | Pi et al. | 370/328 |
| 2011/0206000 A1* | 8/2011 | Kwon et al. | 370/330 |
| 2011/0228732 A1* | 9/2011 | Luo et al. | 370/329 |
| 2011/0249635 A1* | 10/2011 | Chen et al. | 370/329 |
| 2011/0255631 A1* | 10/2011 | Pi | 375/295 |
| 2012/0076102 A1* | 3/2012 | Ko et al. | 370/329 |
| 2012/0127907 A1* | 5/2012 | Gou et al. | 370/312 |

* cited by examiner

TECHNIQUES FOR CYCLIC REDUNDANCY CHECK ENCODING IN COMMUNICATION SYSTEM

CROSS-REFERENCE TO RELATED APPLICATIONS

This application claims the benefit under 35 U.S.C. §119(e) of a U.S. Provisional patent application filed on May 3, 2010 in the U.S. Patent and Trademark Office and assigned Ser. No. 61/330,722, the entire disclosure of which is hereby incorporated by reference.

BACKGROUND OF THE INVENTION

1. Field of the Invention

Aspects of the present invention relate to a communication system. More particularly, aspects of the present invention relate to Cyclic Redundancy Check (CRC) encoding in a communication system.

2. Description of the Related Art

A Cyclic Redundancy Check (CRC) refers to an error detection method employed in a communication system for reliably detecting an error in communicated information by comparing a CRC code generated by a sender to a CRC code generated by a receiver. Examples of communication systems that implement CRC are systems based on a 3rd Generation Partnership Project (3GPP) Long Term Evolution (LTE) standard and a 3GPP LTE-Advanced (LTE-A) standard, which are hereafter referred to as an LTE system and an LTE-A system, respectively. While use of CRC is beneficial for all communicated information in the LTE system and the LTE-A system, CRC is particularly beneficial for the communication of control channel information.

An example of a control channel message in the LTE system and an LTE-A system is a Physical Downlink Control Channel (PDCCH), which carries scheduling assignments and other control information. In the LTE or LTE-A system, the PDCCH is transmitted from a base station, which is also referred to as an evolved Node B (eNB), and received by a User Equipment (UE). Hereafter, a UE that is an intended recipient of the PDCCH message is referred to as an intended UE and a UE that is not an intended recipient of the PDCCH message is referred to as an unintended UE.

The transmission by an eNB and the reception by a UE of PDCCH messages in the LTE or LTE-A system will be described below with reference to FIG. 1 and FIG. 2, respectively.

FIG. 1 illustrates a structure in an eNB for transmission of PDCCH messages in an LTE or LTE-A system according to the related art.

Referring to FIG. 1, the structure in the eNB for the transmission of PDCCH messages in the LTE or LTE-A system includes Cyclic Redundancy Check (CRC) encoders 102-A and 102-B, Tail-Biting Convolution Code (TBCC) encoders 104-A and 104-B, rate matchers 106-A and 106-B, a multiplexor/aggregator 108, a scrambler 110, a modulator 112, a Multiple-Input and Multiple-Output (MIMO) Transmission (TX) processor 114, a resource mapper 116, a multiplexor 118, and an Inverse Fast Fourier Transform (IFFT) unit 120.

In FIG. 1, the CRC encoder 102-A encodes a PDCCH message Msg_A for error detection. The PDCCH message Msg_A was generated by a PDCCH message generator (not shown). A CRC field of the CRC encoded message is scrambled by a UE identifier of an intended UE. The UE identifier may also be referred to as a Radio Network Temporary Identifier (RNTI) in the LTE or LTE-A system. There are different types of RNTIs in the LTE or LET-A system, e.g., a Cell-RNTI (C-RNTI), a Random Access-RNTI (RA-RNTI), etc. The purpose of scrambling the CRC field by the UE identifier is to allow only the intended UE (or UEs) to correctly detect the PDCCH message while having the PDCCH message appear as an erroneous message to other UEs that are unintended UEs.

The TBCC encoder 104-A encodes the CRC encoded message using a ⅓ rate TBCC. The rate matcher 106-A selects a number of coded bits from all the coded bits for the message generated by the TBCC encoder 104-A. The purpose of the rate matcher 106-A is to match the number of transmitted coded bits of the PDCCH message with an amount of resources allocated for transmission of that PDCCH message.

The CRC encoder 102-B, the TBCC encoder 104-B, the rate matcher 106-B perform the same operations on PDCCH message Msg_B as the operations described above by the CRC encoder 102-A, the TBCC encoder 104-A, and the rate matcher 106-A on the PDCCH message Msg_A, and thus a description thereof will be omitted for brevity.

Multiple PDCCH messages, such as Msg_A and Msg_B, can be transmitted in one Transmission Time Interval (TTI). The multiple PDCCH messages transmitted in one TTI can be intended for one or multiple UEs. In the LTE or LTE-A system, one TTI corresponds to one subframe, which has a time span of 1 ms. The coded bits from multiple PDCCH messages are multiplexed together by the multiplexor/aggregator 108, scrambled by the scrambler 110 using a cell-specific scrambling sequence, and then modulated by the modulator 112 using a Quadrature Phase Shift Keying (QPSK) modulation.

If multiple antennas are deployed, the MIMO TX processor 114 may perform MIMO processing on the modulation symbols output from the modulator 112. For example, in the LTE system, a Space-Frequency Block Coding (SFBC) or a SFBC-Frequency Switched Transmit Diversity (FSTD) scheme can be applied to PDCCH modulation symbols for an eNB with two transmit antennas or four transmit antennas, respectively.

After MIMO processing, a stream of modulation symbols are generated for each transmit antenna (or antenna port). Upon further interleaving, the modulation symbols are mapped by the resource mapper 116 to Resource Elements (REs) on a time-frequency grid of a subframe that comprises multiple Orthogonal Frequency-Division Multiplexing (OFDM) symbols. The multiplexor 118 multiplexes the signal output from the resource mapper 116 and provides the multiplexed signal to the IFFT unit 120. The IFFT unit 120 performs an IFFT operation on the signal output from the multiplexor 118 and outputs the transmission signal.

The eNB transmits multiple PDCCHs by multiplexing the multiple PDCCHs and mapping the modulation symbols for the multiple PDCCH messages to different time-frequency resources. In order to achieve satisfactory performance of the PDCCH, PDCCH messages can be transmitted using different message sizes and different amounts of resources to suit the needs of sending different PDCCH messages to UEs with different channel conditions. It would be cumbersome and inefficient if the transmission format for each PDCCH needed to be signaled to a corresponding intended UE (or UEs). Instead, in the LTE or LTE-A system, only the total amount of resources allocated for the PDCCH is signaled by a Physical Control Format Indicator Channel (PCFICH). As will be discussed below, the UEs employ blind decoding to detect PDCCH messages.

FIG. 2 illustrates a structure in a UE for reception of PDCCH messages in an LTE or LTE-A system according to the related art.

Referring to FIG. 2, the structure in the UE for the reception of PDCCH messages in the LTE or LTE-A system includes CRC decoders 202-1 to 202-K, TBCC decoders 204-1 to 204-K, rate de-matchers 206-1 to 206-K, a de-multiplexor/de-aggregator 208, a descrambler 210, a demodulator 212, a MIMO Reception (RX) processor 214, a resource de-mapper 216, a de-multiplexor and equalizer 218, and a Fast Fourier Transform (FFT) unit 220.

In FIG. 2, the FFT unit 220 performs an FFT operation on a received signal. The de-multiplexor and equalizer 218 de-multiplexes and equalizes the received signal output by the FFT unit 220. The resource de-mapper 216 de-maps symbols from REs on a time-frequency grid of a subframe that comprises multiple OFDM symbols. The MIMO RX processor 214 performs MIMO reception processing on the demapped symbols, which are then demodulated by the demodulator 212 and descrambled by the descrambler 210. The de-multiplexor/de-aggregator 208 de-multiplexes and de-aggregates the signal output from the demodulator 212 and provides the de-multiplexed and de-aggregated signals to the rate de-matchers 206-1 to 206-K. The rate de-matchers 206-1 to 206-K rate de-match the signal output from the de-multiplexor/de-aggregator 208 and each provide a rate de-matched signal to a corresponding one of the TBCC decoders 204-1 to 204-K. The TBCC decoders 204-1 to 204-K TBCC decode the signals provided from the rate de-matchers 206-1 to 206-K and each provide a TBCC decoded signal to a corresponding one of the CRC decoders 202-1 to 202-K. The CRC decoders 202-1 to 202-K CRC decode the signals provided from the TBCC decoders 204-1 to 204-K and output blind decoding hypotheses 1 to K. The process performed between the de-multiplexor/de-aggregator 208 and the CRC decoders 202-1 to 202-K constitutes the receiver blind decoding of the PDCCH messages.

There are a limited number of possibilities where a PDCCH can be transmitted, and a limited number of possible PDCCH message formats (i.e., Downlink Control Information (DCI) formats). In addition, to limit the total number of blind decodings a UE needs to perform, a number of possibilities where a PDCCH message can be transmitted to a specific UE, and the DCI formats a specific UE needs to detect, are further limited. A UE attempts decoding of a PDCCH message, assuming a possible DCI format on a possible resource location. If the UE is able to successfully decode the message, the CRC for the message passes CRC error detection. Moreover, if the PDCCH message is intended for the UE, the CRC scrambling sequence should match with the RNTI of the UE. A UE can attempt decoding of a PDCCH assuming all possible combinations of DCI formats and resource locations that are eligible for that UE. By doing so, the eNB can eliminate the extra signaling of the DCI formats and the location of the messages to corresponding UEs.

The multiplexing and mapping of PDCCH messages to time-frequency resources in an LT LTE or LTE-A E system will be described below with reference to FIG. 3.

FIG. 3 illustrates multiplexing and mapping of PDCCH messages to time-frequency resources in an LTE or LTE-A system according to the related art.

Referring to FIG. 3, upon encoding, rate matching, scrambling, modulation, and MIMO processing, modulation symbol quadruplets are formed. The modulation symbol quadruplets are interleaved and mapped to Resource Element Groups (REG). Note that every REG comprises four resource elements for data transmission. Accordingly, every REG can carry one modulation symbol quadruplet.

A PDCCH message is transmitted on an aggregation of one or several consecutive Control Channel Elements (CCEs), where a control channel element corresponds to 9 resource element groups. In other words, every CCE corresponds to 9 modulation symbol quadruplets, which in turn corresponds to 36 modulation symbols. For example, as shown in FIG. 3, the first PDCCH is transmitted using 36 modulation symbols $s_0$-$s_{35}$, which is transmitted on 9 resource element groups. These 9 resource element groups form the first CCE. The second PDCCH message is transmitted using another 36 modulation symbols $s_{36}$-$s_{71}$, which is transmitted on another 9 resource element groups. These 9 resource element groups form the second CCE.

In the LTE or LTE-A system, the number of REGs not assigned to the PCFICH or a Physical Hybrid Automatic Repeat-reQuest (ARQ) Indicator Channel (PHICH) is $N_{REG}$. The CCEs available in the LTE or LTE-A system are numbered from 0 and $N_{CCE}$-1, where $N_{CCE}=\lfloor N_{REG}/9 \rfloor$. The PDCCH supports multiple formats, examples of which are shown below in Table 1. A PDCCH message consisting of n consecutive CCEs may only start on a CCE fulfilling i mod n=0, where i is the CCE number. Multiple PDCCH messages can be transmitted in a subframe.

TABLE 1

| PDCCH format | Number of CCEs | Number of REGs | Number of PDCCH bits |
|---|---|---|---|
| 0 | 1 | 9 | 72 |
| 1 | 2 | 18 | 144 |
| 2 | 4 | 36 | 288 |
| 3 | 8 | 72 | 576 |

A PDCCH message, also referred to as Downlink Control Information (DCI), can be transmitted using 1, 2, 4, or 8 CCEs. As indicated above, a PDCCH message consisting of n consecutive CCEs may only start on a CCE fulfilling i mod n=0, where i is the CCE number. As a result, the CCE aggregation exhibits a tree structure, an example of which is shown in FIG. 4.

FIG. 4 illustrates a tree structure of CCE aggregation in an LTE or LTE-A system according to the related art.

The LTE system includes mechanisms to prevent PDCCH message detection error events. For example, scrambling the CRC of a PDCCH message with the RNTI of the intended UE (or UEs) allows only the intended UE (or UEs) to detect the PDCCH message and pass the CRC error detection successfully while other UEs will either not be able to detect the PDCCH message or not to be able to pass the CRC error detection. In addition, measures are taken to limit the number of blind decodings, which reduces the probability of CRC false detection (i.e., an error event that passes CRC error detection for an erroneous PDCCH detection). For example, a PDCCH consisting of n consecutive CCEs may only start on a CCE fulfilling i mod n=0, where i is the CCE number. In summary, the PDCCH is designed such that the intended UE (or UEs) can blindly detect the PDCCH message successfully with a high probability.

In the LTE-A system, carrier aggregation and cross-carrier scheduling are supported. When carrier aggregation is implemented in the LTE-A system, each carrier is referred to as a component carrier. In order for the PDCCH messages in one downlink component carrier to schedule downlink transmission in another downlink component carrier, or to schedule uplink transmission in an uplink component carrier that is paired with another downlink component carrier, the Carrier Indication Field (CIF) is needed in the PDCCH message for the purpose of cross-carrier scheduling.

In addition, the UE monitors a search space (among the total PDCCH control channel region) for the PDCCH messages intended for a specific component carrier. The search spaces for different component carriers are different. When an eNB transmits a PDCCH message to a UE, the eNB transmits the PDCCH message on one (or few) resources within the search space corresponding to the intended component carrier. If the resource used to transmit the PDCCH message is disposed in the portion of the search space for the component carrier that is non-overlapping with the search spaces of any other component carrier, the CIF field of the PDCCH message is redundant because the component carrier information is already implied based on the resources used to transmit the PDCCH message. This scenario can occur quite often. In other words, often times, the CIF is redundant. On the other hand, the PDCCH false detection probability has led to a concern regarding LTE or LTE-A system reliability and operational efficiency. Accordingly, it would be beneficial to improve the false detection capability of the PDCCH message, as well as other control channel messages and payload data.

Therefore, a need exists for techniques for improving the false detection capability of CRC encoded information.

SUMMARY OF THE INVENTION

An aspect of the present invention is to address at least the above-mentioned problems and/or disadvantages and to provide at least the advantages described below. Accordingly, an aspect of the present invention is to provide techniques for Cyclic Redundancy Check (CRC) encoding in communication system.

Another aspect of the present invention is to provide techniques for improving the false detection capability of CRC encoded information, such control channel and payload information in a communication system.

In accordance with an aspect of the present invention, a method for generating a CRC encoded message in a communication system is provided. The method includes generating the message, generating a first CRC for the message, generating a second CRC for the message, scrambling the first CRC by a first bit sequence of the message, and scrambling the second CRC by a second bit sequence of the message.

In accordance with another aspect of the present invention, an apparatus for generating a CRC encoded message in a communication system is provided. The apparatus includes a message generator, a first CRC encoder, and a second CRC encoder. The message generator generates a message. The first CRC encoder generates a first CRC for the message, and scrambles the first CRC by a first bit sequence of the message. The second CRC encoder generates a second CRC for the message, and scrambles the second CRC by a second bit sequence of the message.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, like reference numerals will be understood to refer to like parts, components, and structures.

DETAILED DESCRIPTION OF EXEMPLARY EMBODIMENTS

Figure 1:
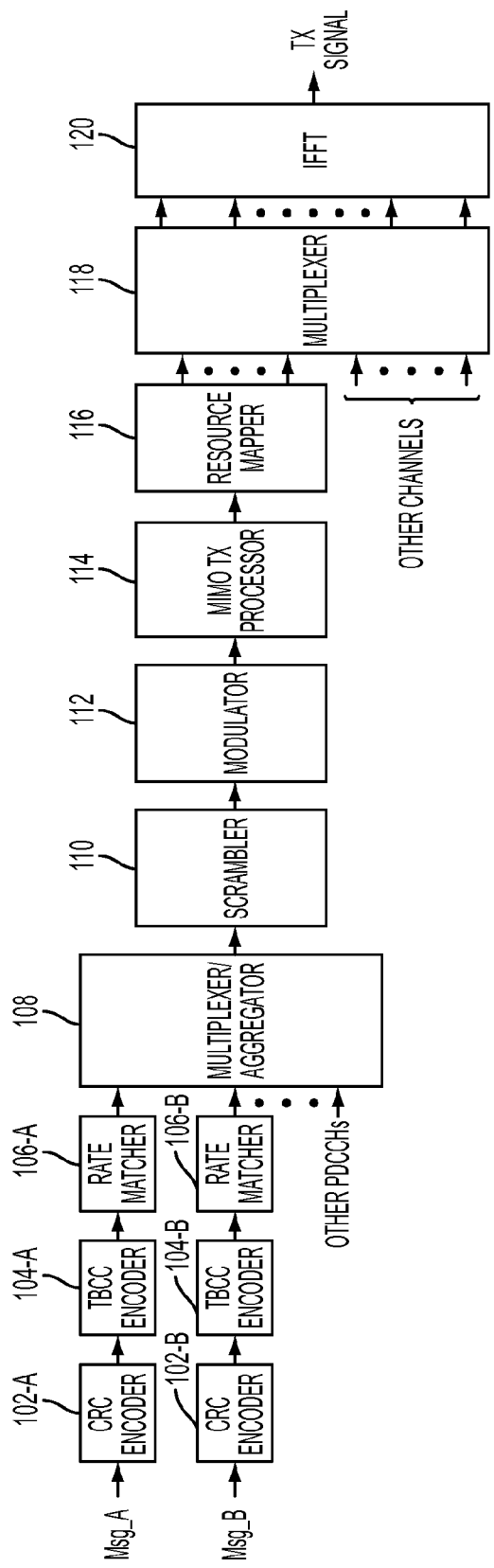
FIG. 1 illustrates a structure in an evolved Node B (eNB) for transmission of Physical Downlink Control Channel (PDCCH) messages in a Long Term Evolution (LTE) or LTE-A system according to the related art.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Exemplary embodiments of the present invention include techniques for Cyclic Redundancy Check (CRC) encoding in communication system. More specifically, exemplary embodiments of the present invention include techniques for improving the false detection capability of CRC encoded information, such control channel and payload information in a communication system.

It should be understood that the following description might refer to terms utilized in various standards merely for simplicity of explanation. For example, the following description may refer to terms utilized in the Institute of Electrical and Electronics Engineers (IEEE) 802.16e standard, IEEE 802.16m standard, $3^{rd}$ Generation Partnership Project (3GPP) Long Term Evolution (LTE) standard, or 3GPP LTE-Advanced (LTE-A) standard. However, this description should not be interpreted as being limited to the IEEE 802.16e, IEEE 802.16m, 3GPP LTE or 3GPP LTE-A standards. Independent of the mechanism used for improving the false detection capability of a control channel message, it is advantageous for that mechanism to conform to a standardized mechanism.

For convenience of description, exemplary embodiments of the present invention will be described in the context of a system based on the LTE or LTE-A standards, which as hereafter referred to as an LTE system or LTE-A system, respectively.

Herein exemplary embodiments of the present invention may be described in the context of an LTE-A Physical Downlink Control Channel (PDCCH) as an example. In addition, exemplary embodiments of the present invention may be described as employing a Carrier Indication Field (CIF) of the LTE-A PDCCH as an example. However, the present invention is equally applicable to embedding other message fields in other messages or packets in the LTE-A system or in any other communication system. For example, the present invention is equally applicable to the communication of payload data.

Hereafter, the terms "transmitter," "base station," and "evolved Node B (eNB)" may be interchangeably used. Likewise, the terms "receiver," and "User Equipment (UE) may be interchangeably used.

Figure 2:
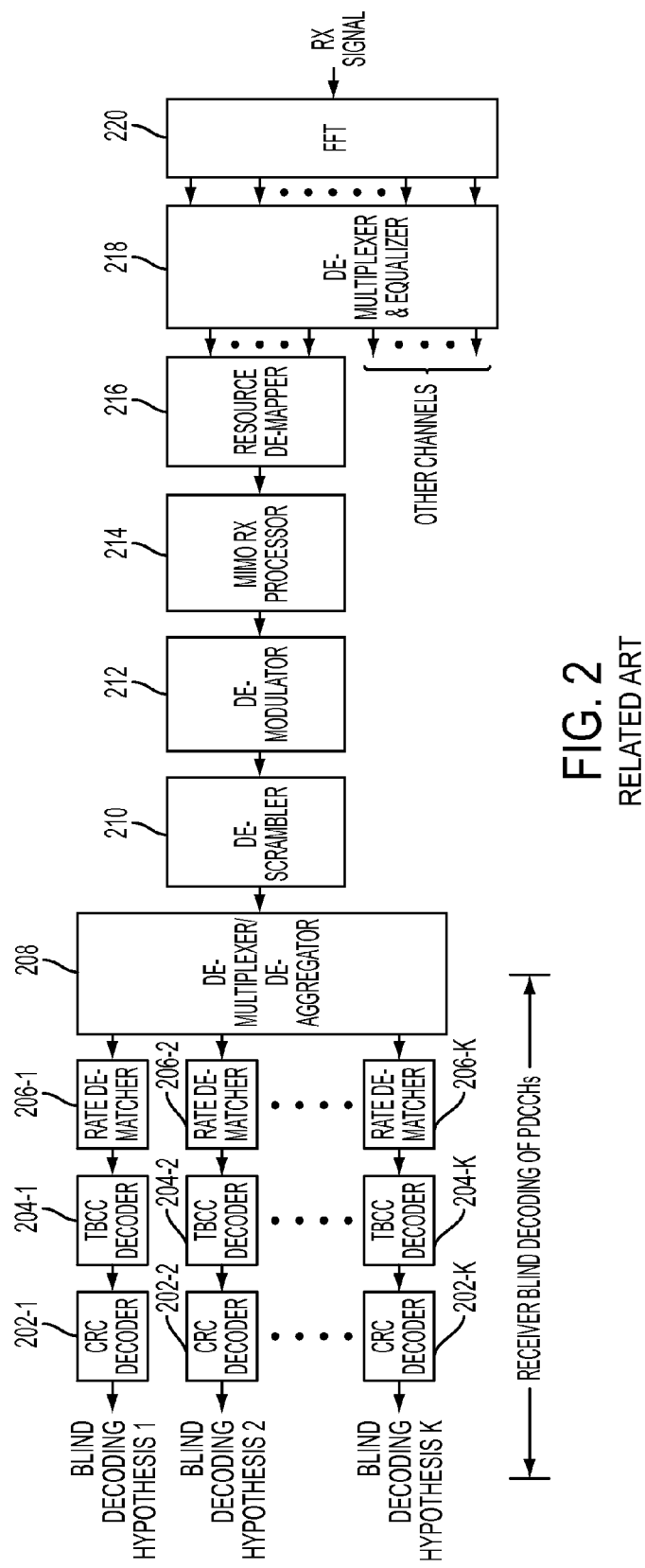
FIG. 2 illustrates a structure in a User Equipment (UE) for reception of PDCCH messages in an LTE or LTE-A system according to the related art.
Figure 3:
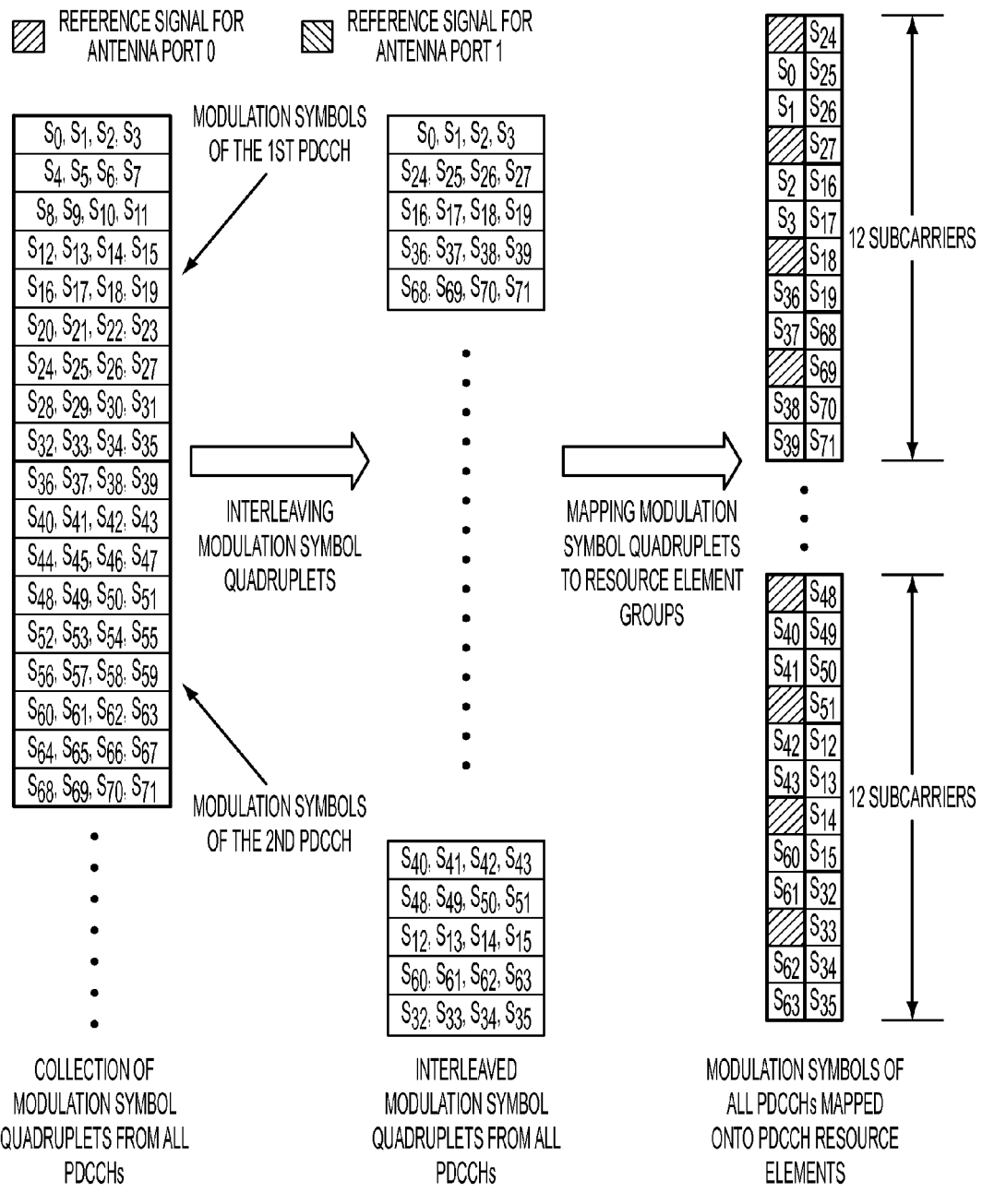
FIG. 3 illustrates multiplexing and mapping of PDCCH messages to time-frequency resources in an LTE or LTE-A system according to the related art.
Figure 4:
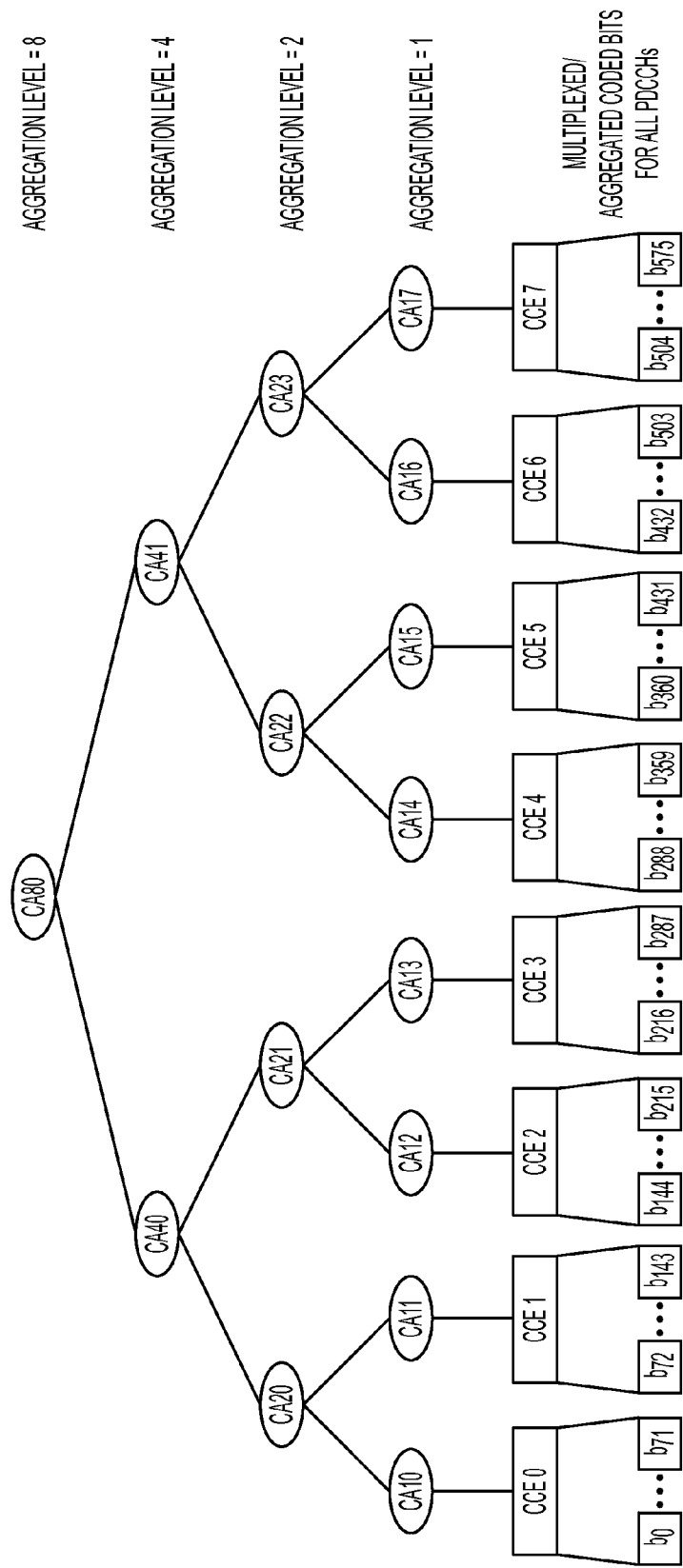
FIG. 4 illustrates a tree structure of Control Channel Element (CCE) aggregation in an LTE or LTE-A system according to the related art.

Exemplary embodiments of the present invention may be implemented using the eNB and UE described above with respect to FIG. 1 and FIG. 2, respectively.

In an exemplary embodiment of the present invention, a first Cyclic Redundancy Check (CRC) is generated for a message and then scrambled by a first bit sequence, and a second CRC is generated for the message and then scrambled by a second bit sequence. An example of a method for the CRC encoding and scrambling according to the present exemplary embodiment is described below with reference to FIG. 5.

Figure 5:
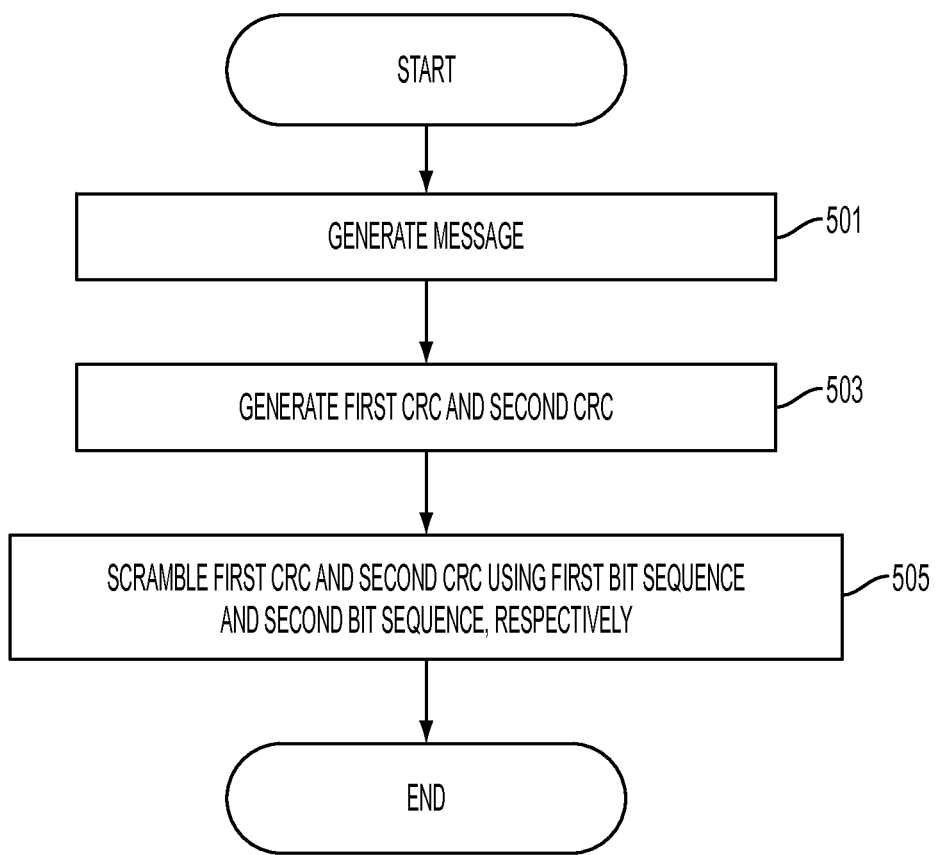
FIG. 5 illustrates a method for generating and scrambling two Cyclic Redundancy Checks (CRCs) for a PDCCH message according to an exemplary embodiment of the present invention.

FIG. 5 illustrates a method for generating and scrambling two CRCs for a message according to an exemplary embodiment of the present invention.

Referring to FIG. 5, in step 501, a message is generated. In step 503, a first CRC and a second CRC for the message are generated. In step 505, the first CRC and second CRC are scrambled using a first bit sequence of the message and a second bit sequence of the message, respectively. When the message is a control channel message, such as a PDCCH message, the first bit sequence of the PDCCH message may be a CIF and the second bit sequence of the PDCCH message may be a Cell-Radio Network Temporary Identifier (C-RNTI). An example of generating and scrambling the first and second CRCs for the PDCCH message will be described below with reference to FIG. 6.

Figure 6:
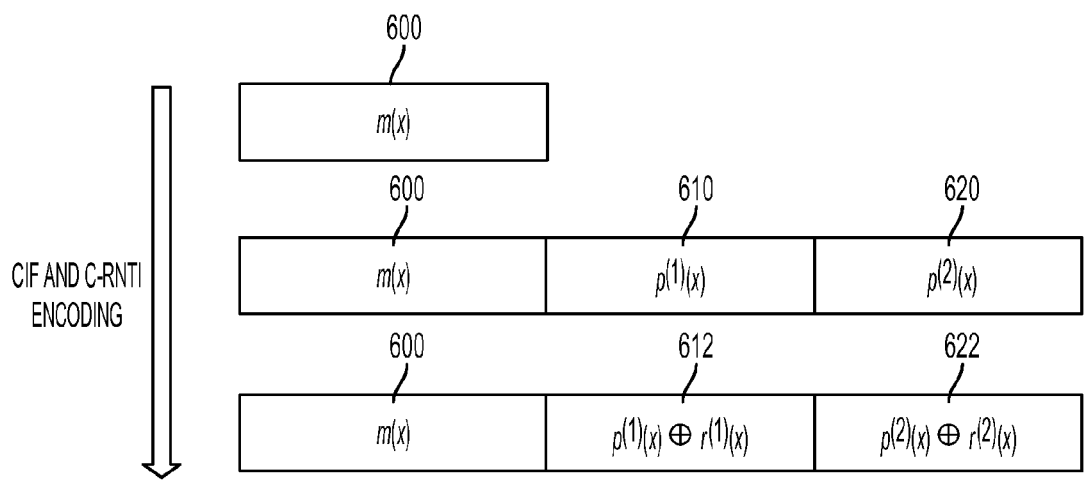
FIG. 6 illustrates an example of generating and scrambling two CRCs for a PDCCH message according to an exemplary embodiment of the present invention.

FIG. 6 illustrates an example of generating and scrambling two CRCs for a PDCCH message according to an exemplary embodiment of the present invention.

Referring to FIG. 6, bits of a PDCCH message 600 may be denoted as $m_0, m_1, \ldots, m_{N-1}$ where N is the number of bits of the PDCCH message. The PDCCH message 600 can also be represented in polynomial form as $m(x)=m_0 x^{N-1}+m_1 x^{N-2}+\ldots+m_{N-2}x+m_{N-1}$.

The generator polynomial of a first CRC 610 may be denoted as $g^{(1)}(x)=g_0^{(1)}x^{K-1}+g_1^{(1)}x^{K-2}+\ldots+g_{K-2}^{(1)}x+g_{K-1}^{(1)}$, and the generator polynomial of a second CRC 620 may be denoted as $g^{(2)}(x)=g_0^{(2)}x^{L-1}+g_1^{(1)}x^{L-2}+\ldots+g_{L-2}^{(1)}x+g_{L-1}^{(1)}$.

The first CRC 610 may be denoted as $p^{(1)}(x)=p_0^{(1)}x^{K-1}+p_1^{(1)}x^{K-2}+\ldots+p_{K-2}^{(1)}x+p_{K-1}^{(1)}$. The first CRC 610 is generated such that $m(x) \cdot x^K + p^{(1)}(x) = g^{(1)}(x) \cdot q^{(1)}(x)$. In other words, $p^{(1)}(x) = m(x) \cdot x^K + g^{(1)}(x) \cdot q^{(1)}(x)$.

The second CRC 620 may be denoted as $p^{(2)}(x) = p_0^{(2)}x^{L-1}+p_1^{(2)}x^{L-2}+\ldots+p_{L-2}^{(2)}x+p_{L-1}^{(2)}$. The second CRC 620 may be generated such that $m(x) \cdot x^L + p^{(2)}(x) = g^{(2)}(x) \cdot q^{(2)}(x)$. In other words, $p^{(2)}(x) = m(x) \cdot x^L + g^{(2)}(x) \cdot q^{(2)}(x)$.

The first CRC 610 and the second CRC 620 are scrambled by the first bit sequence and the second bit sequence, respectively.

The scrambled CRC fields 612 and 622 are then appended to the payload of the PDCCH message 600, resulting in a bit sequence of $[m(x) \cdot x^K + p^{(1)}(x) + r^{(1)}(x)] \cdot x^L + p^{(2)}(x) + r^{(2)}(x)$. The scrambled CRC fields 612 and 622 may be appended to the end of the PDCCH message. Alternatively, the bit sequence can also be written as $m(x) \cdot x^{K+L} + [p^{(1)}(x) \cdot x^L + p^{(2)}(x)] + [r^{(1)}(x) \cdot x^L + r^{(2)}(x)]$.

While the first CRC 610 and the second CRC 620 have been described as being scrambled and then appended to the payload of the PDCCH message 600, the first CRC 610 and the second CRC 620 may alternatively be appended to the payload of the PDCCH message 600 and then scrambled.

The first bit sequence, $r_1(x)$, can be a CIF, and the second bit sequence, $r_2(x)$, can be a C-RNTI. The length of the CIF and the length of the first CRC 610 can be 3-bits. The length of the C-RNTI and the length of the second CRC 620 can be 16-bits. Both the first CRC 610 and the second CRC 620 can be generated from the payload of the PDCCH message 600 separately. The advantage of this approach is that the 16-bit CRC and the procedure of scrambling the 16-bit CRC with a 16-bit C-RNTI according to an LTE system of the related art can be reused in LTE-A system. In addition, when the CIF can be assumed or derived from other mechanisms, the 3-bit CRC can reduce the false detection probability of the PDCCH message 600.

In one exemplary embodiment of the present invention, a first CRC is generated for a message and a first bit sequence is used to scramble the first CRC. A second CRC is then generated for the message, including the appended scrambled first CRC, and a second bit sequence is used to scramble the appended second CRC. An example of a method for the CRC encoding and scrambling process according to the present exemplary embodiment is described below with reference to FIG. 7.

Figure 7:
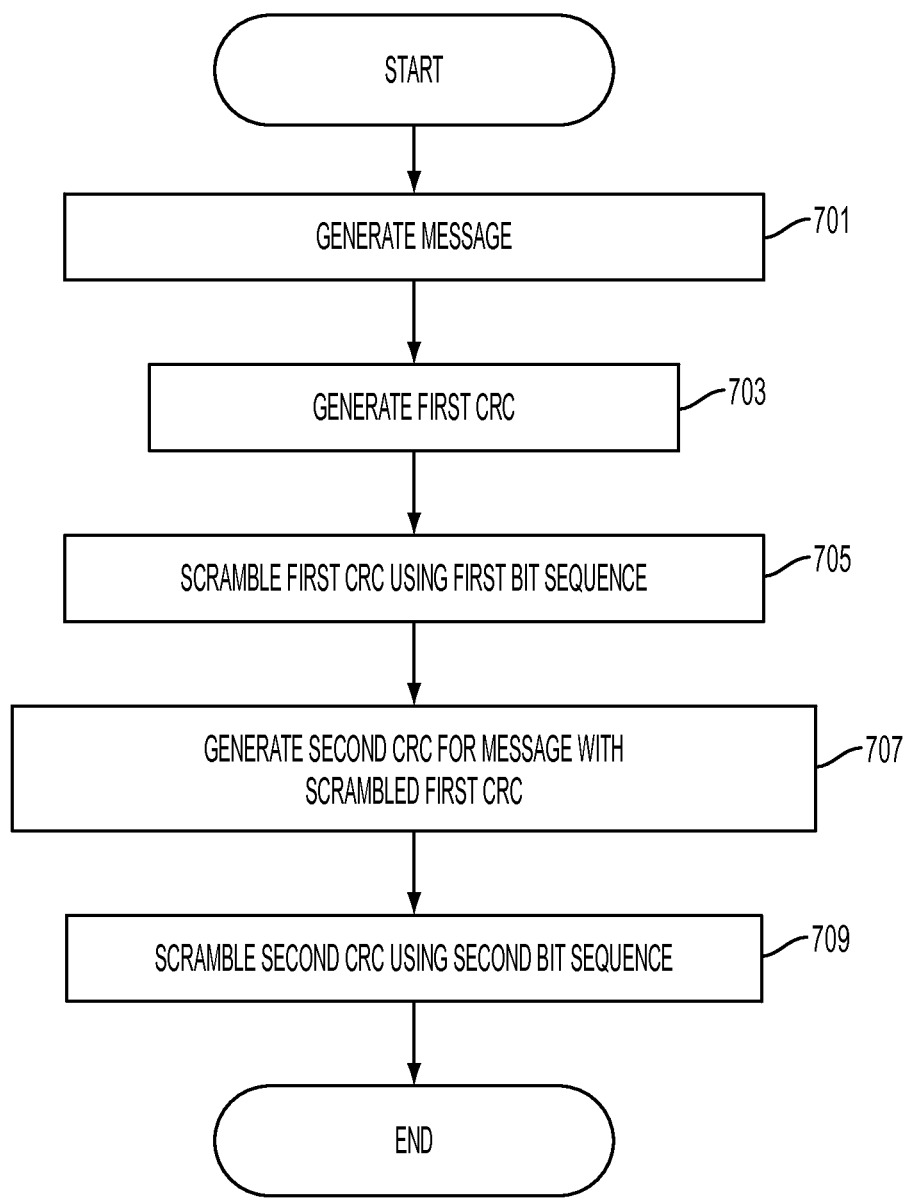
FIG. 7 illustrates another method for generating and scrambling two CRCs for a PDCCH message according to an exemplary embodiment of the present invention.

FIG. 7 illustrates another method for generating and scrambling two CRCs for a message according to an exemplary embodiment of the present invention.

Referring to FIG. 7, in step 701, a message is generated. In step 703, a first CRC for the message is generated. In step 705, the first CRC is scrambled using a first bit sequence of the message. In step 707, a second CRC for the message, which includes the scrambled first CRC, is generated. In step 709, the second CRC for the message is scrambled. When the message is a control channel message, such as a PDCCH message, the first bit sequence of the PDCCH message may be a CIF and the second bit sequence of the PDCCH message may be a C-RNTI. An example of generating and scrambling the first and second CRCs for the PDCCH message will be described below with reference to FIG. 8.

Figure 8:
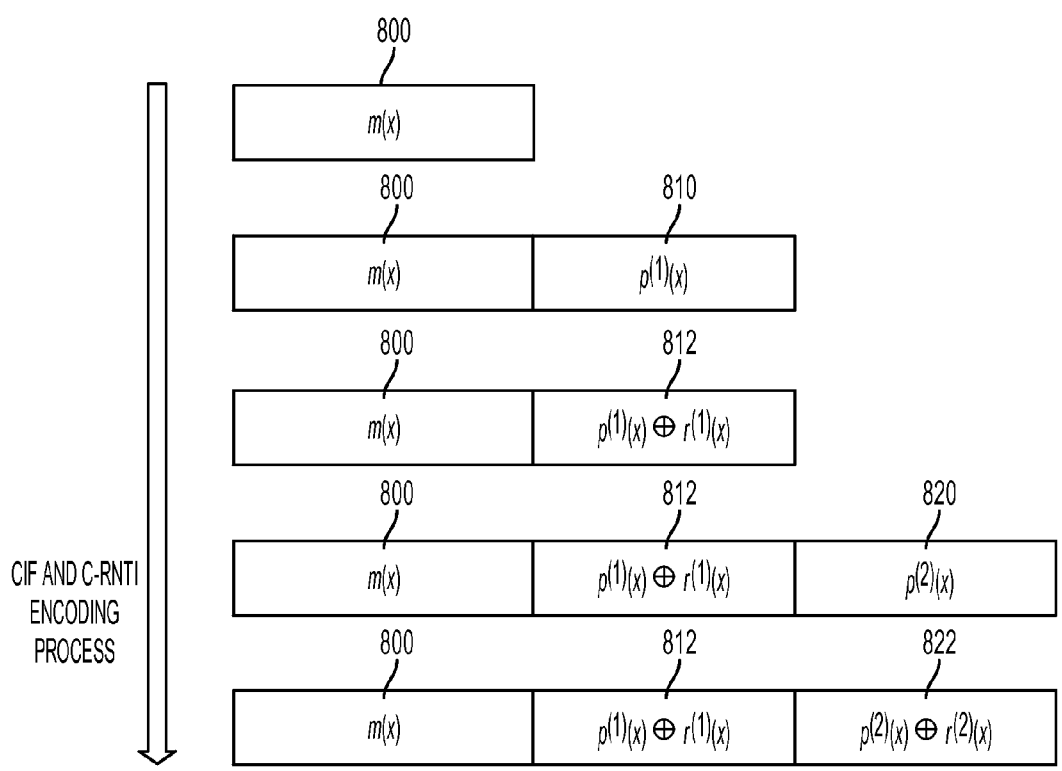
FIG. 8 illustrates another example of generating and scrambling two CRCs for a PDCCH message according to an exemplary embodiment of the present invention.

FIG. 8 illustrates another example of generating and scrambling two CRCs for a PDCCH message according to an exemplary embodiment of the present invention.

Referring to FIG. 8, bits of a PDCCH message 800 may be denoted as $m_0, m_1, \ldots, m_{N-1}$ where N is the number of bits of the PDCCH message 800. The PDCCH message 800 can also be represented in polynomial form as $m(x)=m_0 x^{N-1} + m_1 x^{N-2} + \ldots + m_{N-2} x + m_{N-1}$.

The generator polynomial of a first CRC 810 may be denoted as $g^{(1)}(x) = g_0^{(1)} x^{K-1} + g_1^{(1)} x^{K-2} + \ldots + g_{K-2}^{(1)} x + g_{K-1}^{(1)}$, and the generator polynomial of a second CRC 820 as $g^{(2)}(x) = g_0^{(2)} x^{L-1} + g_1^{(1)} x^{L-2} + \ldots + g_{L-2}^{(1)} x + g_{L-1}^{(1)}$.

The first CRC 810 may be denoted as $p^{(1)}(x) = p_0^{(1)} x^{K-1} + p_1^{(1)} x^{K-2} + \ldots + p_{K-2}^{(1)} x + p_{K-1}^{(1)}$. The first CRC 810 is generated such that $m(x) \cdot x^K + p^{(1)}(x) = g^{(1)}(x) \cdot q^{(1)}(x)$. In other words, $p^{(1)}(x) = m(x) \cdot x^K + g^{(1)}(x) \cdot q^{(1)}(x)$.

The PDCCH message 800 with the first CRC 810 appended is then scrambled by the first bit sequence, resulting in a scrambled first CRC field 812 with a bit sequence of $m(x) \cdot x^K + p^{(1)}(x) + r^{(1)}(x)$.

While the first CRC 810 has been described as being appended to the payload of the PDCCH message 800 and then scrambled, the first CRC 810 may alternatively be scrambled and then appended to the payload of the PDCCH message 800.

The second CRC 820 may be denoted as $p^{(2)}(x) = p_0^{(2)} x^{L-1} + p_1^{(2)} x^{L-2} + \ldots + p_{L-2}^{(2)} x + p_{L-1}^{(2)}$. The second CRC may be generated such that $[m(x) \cdot x^K + p^{(1)}(x) + r^{(1)}(x)] \cdot x^L + p^{(2)}(x) = g^{(2)}(x) \cdot q^{(2)}(x)$. In other words, $p^{(2)}(x) = [m(x) \cdot x^K + p^{(1)}(x) + r^{(1)}(x)] \cdot x^L + g^{(2)}(x) \cdot q^{(2)}(x)$.

The PDCCH message 800 with the first CRC 810 and the second CRC 820 appended is then scrambled by the second bit sequence, resulting in a scrambled second CRC field 822 with a bit sequence of $[m(x) \cdot x^K + p^{(1)}(x) + r^{(1)}(x)] \cdot x^L + p^{(2)}(x) + r^{(2)}(x)$. Alternatively, the bit sequence can also be written as $m(x) \cdot x^{K+L} + [p^{(1)}(x) \cdot x^L + p^{(2)}(x)] + [r^{(1)}(x) \cdot x^L + r^{(2)}(x)]$.

While the second CRC 820 has been described as being appended to the payload of the PDCCH message 800 and then scrambled, the second CRC 820 may alternatively be scrambled and then appended to the payload of the PDCCH message 800.

The advantage of this CRC encoding and message fields embedding scheme is that the legacy 16-bit CRC can be reused as the second CRC 820. In addition, a 3-bit CRC (i.e., the first CRC 810) is introduced. Note that the 3-bit CRC should be scrambled by the 3-bit CIF. During the detection of a message or blind detection of a hypothesis for a PDCC message, a UE often knows or assumes one or a few values of the CIF. As a result, the 3-bit CRC that is scrambled by the CIF can provide additional error detecting capability for the rest of the message fields. Moreover, because the second CRC 820 is generated from all message fields preceding the second CRC 820, this encoding scheme provides good backward compatibility in the sense that it allows the UE that does not support the first CRC 810 (e.g., UEs configured to operate according to LTE instead of LTE-A) to only use the second CRC 820 and follows the LTE CRC decoding process.

Note that in the LTE system, a code block CRC for each code block and a transport block CRC for each transport block are used to provide error detection capability for a transport block that is segmented into multiple code blocks. However, the two CRC generator polynomials that may be chosen for code block CRC and transport block CRC are not co-prime, thereby resulting in reduced effectiveness in error detection.

When assuming the code block CRC uses generator polynomial $g_{CB}(x) = g_0(x) \cdot g_1(x)$, the transport block CRC uses generator polynomial $g_{TB}(x) = g_0(x) \cdot g_2(x)$, where $g_0(x)$ is the greatest common factor between $g_{CB}(x)$ and $g_{TB}(x)$. Here, $g_1(x)$ and $g_2(x)$ are co-prime. In order for an error message to pass the error detection of both the code block CRC and the transport block CRC, the error message needs to be divisible by the both $g_{CB}(x)$ and $g_{TB}(x)$, which means the error message needs to be divisible by $g_0(x) \cdot g_1(x) \cdot g_2(x)$. To minimize the number of error messages that pass both CRC generator polynomials, it is preferable to have the order of the polynomial $g_0(x) \cdot g_1(x) \cdot g_2(x)$ to be as large as possible. Assuming the order of $g_{CB}(x)$ is $L_{CB}$, the order of $g_{TB}(x)$ is $L_{TB}$, the order of $g_0(x)$ is $L_0$, the order of $g_1(x)$ is $L_1$, and the order of $g_2(x)$ is $L_2$. Here, $L_{CB} = L_0 + L_1$, and $L_{TB} = L_0 + L_2$. The order of $g_0(x) \cdot g_1(x) \cdot g_2(x)$ is $L_0 + L_1 + L_2 = (L_{CB} + L_{TB}) - L_0$. As a result, the order of $g_0(x) \cdot g_1(x) \cdot g_2(x)$ is maximized if the order of the greatest common factor between $g_{CB}(x)$ and $g_{TB}(x)$ is minimized, which means that the order of $g_0(x) \cdot g_1(x) \cdot g_2(x)$ is maximized when $g_{CB}(x)$ and $g_{TB}(x)$ are co-prime.

In one exemplary embodiment of the present invention, a first CRC is generated for a code block by using a first generator polynomial and a second CRC is generated for a transport block by using a second generator polynomial that is co-prime with the first generator polynomial. The code block can be either the transport block or a segment of the transport block. The first CRC is the code block CRC, and the second CRC is the transport block CRC. The code block CRC is generated based on the bits in the code block. The transport block CRC is generated based on the bits in the transport block, and the calculation may also include the bits of the code block CRC.

In one exemplary embodiment of the present invention, a first CRC is generated for a message by using a first generator polynomial and a second CRC is generated for the said message by using a second generator polynomial such that the first generator polynomial is co-prime with the second generator polynomial. The first CRC can be masked by a first bit sequence and the second CRC can be masked by a second bit sequence. For example, the first bit sequence can be a CIF, and the second bit sequence can be a C-RNTI. The second CRC can use the 16-bit CRC generator polynomial from the LTE system, which may be denoted as $g_{CRC16}(x) = x^{16} + x^{12} + x^5 + 1$. The first CRC can use a generator polynomial denoted as $g_{CRCa}(x) = x^a + x^2 + 1$.

Here, the first CRC generator polynomial is co-prime with the second CRC generator polynomial. In other words, these two CRC generator polynomials do not have a common polynomial factor (other than the trivial polynomial factor of 1). Alternatively, the first CRC can use a generator polynomial denoted as $g_{CRCa}(x) = x^a + x + 1$.

In one exemplary embodiment of the present invention, a CRC is generated for a message with a first portion of the said CRC scrambled by a first bit sequence and a second portion of the said CRC scrambled by a second bit sequence. For example, the first bit sequence can be a CIF, and the second bit sequence can be a C-RNTI. The length of the CIF can be 3-bits. The length of the C-RNTI can be 16-bits. And the length of the CRC can be 19-bits. The 19-bit CRC generator polynomial can be obtained by multiplying the 16-bit CRC generator polynomial with a 3-bit CRC generator polynomial. For example, one choice of the 19-bit CRC generator polynomial can be expressed as $g_{CRC19}(x)=g_{CRC16}(x) \cdot g_{CRCa}(x)=(x^{16}+x^{12}+x^5+1) \cdot (x^a+x^2+1)=x^{19}+x^{18}+x^{16}+x^{15}+x^{14}+x^{12}+x^8+x^7+x^5+x^3+x^2+1$. Alternatively, the 19-bit CRC generator polynomial can be chosen as $g_{CRC19}(x)=g_{CRC16}(x) \cdot g_{CRCa}(x)=(x^{16}+x^{12}+x^5+1) \cdot (x^a+x^2+1)=x^{19}+x^{17}+x^{16}+x^{15}+x^{13}+x^{12}+x^8+x^6+x^5+x^3+x+1$.

The structure of an apparatus in for generating a CRC encoded control channel message in described below with reference to FIG. 9.

Figure 9:
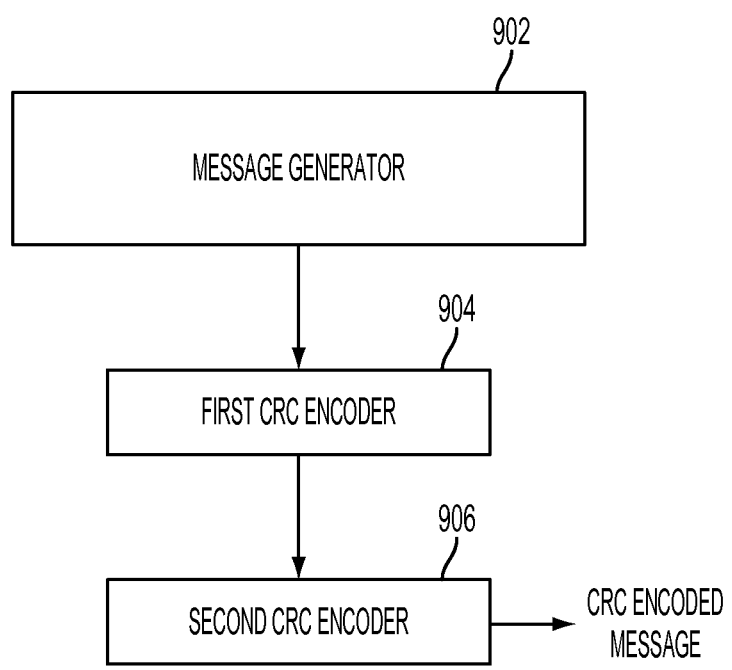
FIG. 9 illustrates a structure of an apparatus for generating a CRC encoded control channel message according to an exemplary embodiment of the present invention.

FIG. 9 illustrates a structure of an apparatus for generating a CRC encoded message according to an exemplary embodiment of the present invention.

Referring to FIG. 9, the apparatus includes a message generator 902, a first CRC encoder 904, and a second CRC encoder 906. The apparatus may include additional elements (not shown). In addition, the functions of each of the control channel message generator 902, the first CRC encoder 904, and the second CRC encoder may be performed by one or a plurality of elements. Also, the functions of the generator 902, the CRC encoder 904, and the second CRC encoder 906 may be performed by a single element. The apparatus may be comprised by an eNB or a UE of an LTE system, LTE-A system, or another communication system.

The control channel message generator 902 generates a message, such as a PDCCH message. The first CRC encoder 904 may perform any of the CRC encoding operations described herein with respect to a first CRC. For example, the first CRC encoder 904 generates a first CRC for the message, and scrambles the first CRC by a first bit sequence of the message. The second CRC encoder 906 may perform any of the CRC encoding operations described herein with respect to a second CRC. For example, the second CRC encoder 906 generates a second CRC for the message, and scrambles the second CRC by a second bit sequence of the PDCCH message.

Certain exemplary embodiments of the present invention have been described in the context of encoding a CIF and C-RNTI in PDCCH messages in an LTE-A system as an example. However, as would be appreciated by a person of ordinary skill in the art, techniques described herein may be applied to message fields other than the CIF and C-RNTI in a control channel message. Further, as would be appreciated by a person of ordinary skill in the art, the techniques described herein may be employed for any other communicated information in any type of communication system. Such implementations are to be considered as being within the scope of the present invention.

Certain aspects of the present invention may also be embodied as computer readable code on a computer readable recording medium. A computer readable recording medium is any data storage device that can store data, which can be thereafter read by a computer system. Examples of the computer readable recording medium include Read-Only Memory (ROM), Random-Access Memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion. Also, functional programs, code, and code segments for accomplishing the present invention can be easily construed by programmers skilled in the art to which the present invention pertains.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A method for generating a Cyclic Redundancy Check (CRC) encoded message in a communication system, the method comprising:
generating a CRC encoded message;
generating a first CRC for the message;
generating a second CRC for the message;
scrambling the first CRC by a first bit sequence of the message; and
scrambling the second CRC by a second bit sequence of the message.

2. The method of claim 1, wherein the first CRC and the second CRC are independently generated.

3. The method of claim 2, further comprising appending the first CRC and second CRC to the message before the scrambling of the first CRC and the scrambling of the second CRC.

4. The method of claim 2, further comprising, after the scrambling of the first CRC and the scrambling of the second CRC, appending the first scrambled CRC and the second scrambled CRC to the message.

5. The method of claim 1, wherein the generating of the second for the CRC message comprises appending the first CRC to the message and generating the second CRC from the message including the first CRC.

6. The method of claim 5, wherein the first CRC is appended to the message before the scrambling of the first CRC.

7. The method of claim 5, wherein the first CRC is scrambled before the appending of the first CRC to the message.

8. The method of claim 5, further comprising appending the second CRC to the message before the scrambling of the second CRC.

9. The method of claim 5, further comprising scrambling the second CRC and appending the scrambled second CRC to the message.

10. The method of claim 1, wherein the message is a control channel message.

11. The method of claim 10, wherein the control channel message is a Physical Downlink Control Channel (PDCCH) message.

12. The method of claim 10, wherein the first bit sequence of the control channel message is a Carrier Indication Field (CIF) of the control channel message.

13. The method of claim 10, wherein the first bit sequence of the control channel message is a 3-bit sequence and the first CRC is a 3-bit CRC.

14. The method of claim 10, wherein the second bit sequence of the control channel message is a Cell-Radio Network Temporary Identifier (C-RNTI) of the control channel message.

15. The method of claim 10, wherein the second bit sequence of the control channel message is a 16-bit sequence and the second CRC is a 16-bit CRC.

16. The method of claim 1, wherein the communication system is a communication system based on one of a 3rd Generation Partnership Project (3GPP) Long Term Evolution (LTE) standard and a 3GPP LTE-Advanced (LTE-A) standard.

17. The method of claim 1, wherein the first CRC and the second CRC are generated using generator polynomials that are co-prime.

18. The method of claim 1, wherein the first CRC is a CRC for a code block of the message and the second CRC is a CRC for a transport block of the message.

19. The method of claim 18, wherein the first bit sequence includes bits from the code block of the message and the second bit sequence includes bits from the transport block of the message.

20. An apparatus for generating a Cyclic Redundancy Check (CRC) encoded message in a communication system, the apparatus comprising:
a message generator for generating a CRC encoded message;
a first CRC encoder for generating a first CRC for the message, and for scrambling the first CRC by a first bit sequence of the message; and
a second CRC encoder for generating a second CRC for the message, and for scrambling the second CRC by a second bit sequence of the message.

21. The apparatus of claim 20, wherein the generation of the first CRC by the first CRC encoder is independent from the generation of the second CRC by the second CRC encoder.

22. The apparatus of claim 21, wherein the first CRC encoder appends the first CRC to the message before the scrambling of the first CRC, and the second CRC encoder appends the second CRC to the message before the scrambling of the second CRC.

23. The apparatus of claim 21, wherein the first CRC encoder scrambles the first CRC and appends the scrambled first CRC to the message, and the second CRC encoder scrambles the second CRC and appends the scrambled second CRC to the message.

24. The apparatus of claim 20, wherein the second CRC encoder generates the second CRC for the message, the message including the scrambled first CRC.

25. The apparatus of claim 24, wherein the first CRC encoder appends the first CRC to the message before the scrambling of the first CRC.

26. The apparatus of claim 24, wherein the first CRC encoder scrambles the first CRC and appends the scrambled first CRC to the message.

27. The apparatus of claim 24, wherein the second CRC encoder appends the second CRC to the message before the scrambling of the second CRC.

28. The apparatus of claim 24, wherein the second CRC encoder scrambles the second CRC and appends the scrambled second CRC to the message.

29. The apparatus of claim 20, wherein the message is a control channel message.

30. The apparatus of claim 29, wherein the control channel message is a Physical Downlink Control Channel (PDCCH) message.

31. The apparatus of claim 29, wherein the first bit sequence of the control channel message is a Carrier Indication Field (CIF) of the control channel message.

32. The apparatus of claim 29, wherein the first bit sequence of the control channel message is a 3-bit sequence and the first CRC is a 3-bit CRC.

33. The apparatus of claim 29, wherein the second bit sequence of the control channel message is a Cell-Radio Network Temporary Identifier (C-RNTI) of the control channel message.

34. The apparatus of claim 29, wherein the second bit sequence of the control channel message is a 16-bit sequence and the second CRC is a 16-bit CRC.

35. The apparatus of claim 20, wherein the communication system is a communication system based on one of a 3rd Generation Partnership Project (3GPP) Long Term Evolution (LTE) standard and a 3GPP LTE-Advanced (LTE-A) standard.

36. The apparatus of claim 20, wherein the first CRC encoder generates the first CRC and the second encoder generates the second CRC using generator polynomials that are co-prime.

37. The apparatus of claim 20, wherein the apparatus is comprised by at least one of an evolved Node B (eNB) and a User Equipment (UE).

38. The apparatus of claim 20, wherein the first CRC is a CRC for a code block of the message and the second CRC is a CRC for a transport block of the message.

39. The apparatus of claim 38, wherein the first bit sequence includes bits from the code block of the message and the second bit sequence includes bits from the transport block of the message.

* * * * *